USO09646830B2

(12) United States Patent
Cai

(10) Patent No.: US 9,646,830 B2
(45) Date of Patent: May 9, 2017

(54) SEMICONDUCTOR STRUCTURE AND FABRICATION METHOD THEREOF

(71) Applicant: Semiconductor Manufacturing International (Shanghai) Corporation, Shanghai (CN)

(72) Inventor: Guohui Cai, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/690,927

(22) Filed: Apr. 20, 2015

(65) Prior Publication Data
US 2015/0318364 A1 Nov. 5, 2015

(30) Foreign Application Priority Data

May 4, 2014 (CN) .......................... 2014 1 0184366

(51) Int. Cl.
| H01L 21/02 | (2006.01) |
|---|---|
| H01L 29/417 | (2006.01) |
| H01L 29/66 | (2006.01) |
| H01L 21/306 | (2006.01) |
| H01L 21/3065 | (2006.01) |

(52) U.S. Cl.
CPC .... *H01L 21/02639* (2013.01); *H01L 21/0237* (2013.01); *H01L 21/0262* (2013.01); *H01L 21/02381* (2013.01); *H01L 21/02529* (2013.01); *H01L 21/3065* (2013.01); *H01L 21/30604* (2013.01); *H01L 29/41783* (2013.01); *H01L 29/66553* (2013.01); *H01L 29/66628* (2013.01)

(58) Field of Classification Search
CPC ..... H01L 21/823412; H01L 21/823814; H01L 29/41783
See application file for complete search history.

(56) References Cited

U.S. PATENT DOCUMENTS

| 8,134,189 B2 * | 3/2012 | Tamura | H01L 21/82380 257/288 |
|---|---|---|---|
| 8,338,279 B2 * | 12/2012 | Dube | H01L 21/82342 438/492 |

* cited by examiner

*Primary Examiner* — Yu-Hsi D Sun
(74) *Attorney, Agent, or Firm* — Anova Law Group, PLLC

(57) ABSTRACT

According to a semiconductor structure fabrication method, a semiconductor substrate having gate structures is provided. Sidewalls of the gate structures may be covered by a spacer layer. An epitaxy process is performed to form a semiconductor epitaxial material layer covering the gate structures, the spacer layer, and the semiconductor substrate. Then, an etching process is performed to form a first semiconductor epitaxial layer on the semiconductor substrate at the two sides of the gate structures. Further, a selective epitaxy process is performed by using a deposition gas and an etching gas, forming a second semiconductor epitaxial layer. The formed second semiconductor epitaxial layer may repair or compensate the first semiconductor epitaxial layer along the horizontal direction. The epitaxy process, the etching process, and the selective epitaxy process are repeated successively to form elevated source/drain regions. The formed elevated source/drain regions may have a flat top surface without any angles.

19 Claims, 4 Drawing Sheets

SEMICONDUCTOR STRUCTURE AND FABRICATION METHOD THEREOF

CROSS-REFERENCES TO RELATED APPLICATIONS

This application claims the priority of Chinese patent application no. CN201410184366.9, filed on May 4, 2014, the entire content of which is incorporated herein by reference.

FIELD OF THE DISCLOSURE

The present disclosure relates to the field of semiconductor manufacturing technology and, more particularly, relates a semiconductor structure and fabrication method thereof.

BACKGROUND

With the rapid development of the semiconductor manufacturing technology, to obtain semiconductor devices with faster speed, larger storage capacity, and more functions, higher component density and higher degree of integration are the development trend of semiconductor devices. Thus, gate structures of complementary metal oxide semiconductor (CMOS) transistors may become thinner and shorter. To maintain a good electrical performance while reducing feature size, the semiconductor device's carrier mobility may need to be controlled.

One technique for controlling the carrier mobility is to control the stress in the transistor's channels. For example, by properly controlling the stress, carrier (e.g., electrons for N-type transistors, holes for N-type transistor) mobility may increase, thus, the driving current of the transistors may also increase. That is, by using a proper stress, the transistors' performance may increase significantly.

More specifically, in a stress liner technique, a tensile stress liner may be formed on NMOS transistors, and a compressive stress liner may be formed on PMOS transistors. Thus, the driving current of the PMOS transistors and the NMOS transistors may increase. Accordingly, the response speed of the electrical circuit that using the NMOS transistors and/or PMOS transistors may increase. Based on certain studies, by using a double stress liner technique, an integrated circuit may have 24% increase in its performance.

Further, silicon and germanium have the same "diamond" crystal structure. At room temperature, the lattice constant of the germanium may be larger than the silicon. Thus, by forming a silicon germanium (SiGe) layer at the source regions and drain regions of the PMOS transistors, crystal mismatch between the silicon and the SiGe may generate a compressive stress. Thereby, the performance of the PMOS transistors may increase. Accordingly, by forming a silicon carbide (SiC) layer at the source regions and drain regions of the NMOS transistors, crystal mismatch between the silicon and the SiC may generate a tensile stress. Thus, the performance of the NMOS transistors may increase.

Current techniques for forming the SiGe source/drain regions and the SiC source/drain regions may include forming certain gate structures on a semiconductor substrate; forming trenches by etching the semiconductor substrate located on the two sides of the gate structures; and forming the SiGe layer or the SiC layer at the bottom of the trenches by a selective epitaxy process. Further, during the selective epitaxy process, certain deposition gases and certain etching gases may be supplied at the same time. Thus, the SiC layer or the SiGe layer may be selectively formed at the bottom of the trenches.

Moreover, certain subsequent metal silicide process may consume the silicon in the source/drain regions, and may influence the stress at the source/drain regions. To avoid this influence, the surface of the source/drain regions that are formed by the selective epitaxy process may need to be higher than the surface of the semiconductor substrate. This type of source/drain regions is known as the elevated source/drain regions.

However, the elevated source/drain regions formed by current techniques may still have certain defects. The disclosed methods are directed to solve one or more problems set forth above and other problems.

BRIEF SUMMARY OF THE DISCLOSURE

The present disclosure provides a semiconductor structure and the fabrication method thereof. In the semiconductor fabrication process, a semiconductor substrate having certain gate structures is provided first. The sidewalls of the gate structures may be covered by a spacer layer. Then, an epitaxy process is performed by using certain deposition gases, forming a semiconductor epitaxial material layer. The formed semiconductor epitaxial material layer may cover the gate structures, the spacer layer, and the semiconductor substrate. That is, this is a non-selective epitaxial deposition step. Next, an etching process is performed using certain etching gases. In the etching process, because of the etch rate difference between single crystal silicon and amorphous/polysilicon, the amorphous/polysilicon material layer located on the spacer layer will be removed and the silicon layer will be kept. Thus a first semiconductor epitaxial layer may be formed on the semiconductor substrate located at the two sides of the gate structures. Then, a selective epitaxy process may be performed by using certain deposition gases and etching gases. In the selective epitaxy process, a second semiconductor epitaxial layer may be formed on the semiconductor substrate located at the two sides of the gate structures. The formed second semiconductor epitaxial layer may repair or compensate the first semiconductor epitaxial layer along the horizontal direction. Next, the non-selective epitaxy process, the etching process, and the selective epitaxy process are repeated successively. Thus certain elevated source/drain regions may be formed on the semiconductor substrate located at the two sides of the gate structures. The formed elevated source/drain regions may have a flat top surface without any <111>facet. Or the top surface of the formed elevated source/drain regions may only have certain wide angles, not sharp angles.

In addition, the epitaxy process, the etching process, and the selective epitaxy process may be performed in a same chamber. A stable epitaxy environment may be obtained prior performing the epitaxy process, a stable etching environment may be obtained prior performing the etching process, and a stable selective epitaxy environment may be obtained prior performing the selective epitaxy process. The stable environment may enable a better control of the fabrication process. Further, certain P-type or N-type impurities may be introduced into the formed elevated source/drain regions during the epitaxy and/or the selective epitaxy process. Thus the doping process may be performed at the same time, saving cost and time.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

As illustrated in the background section, when forming the elevated source/drain regions, especially when forming the SiC source/drain regions, current techniques may be difficult to be controlled. The formed elevated source/drain regions may have certain defects, and may have large resistance.

Figure 1:
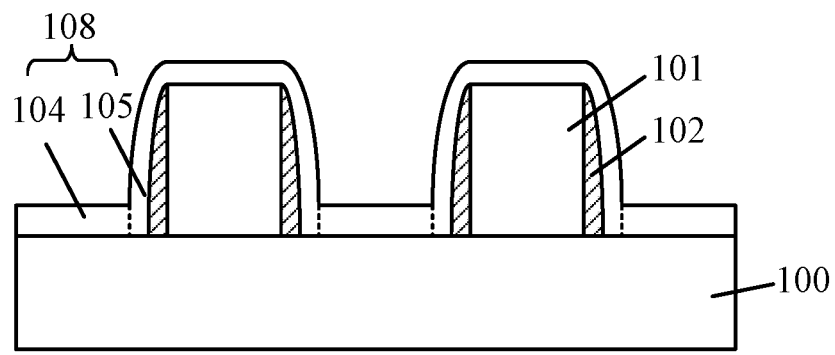
FIGS. 1-3 illustrate sectional views of an exemplary semiconductor structure corresponding to certain stages of a fabrication process consistent with the disclosed embodiments.
Figure 2:
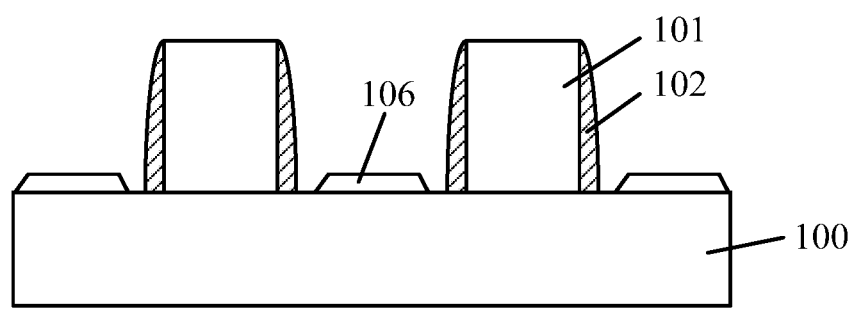
Figure 3:
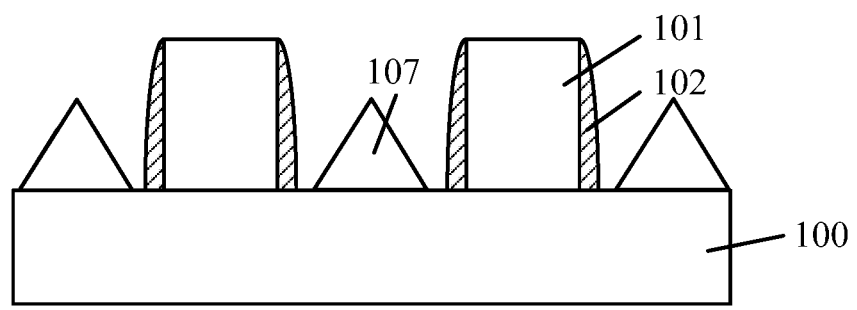

The present disclosure provides a method for forming the elevated source/drain regions. FIGS. 1-3 illustrate sectional views of an exemplary semiconductor structure corresponding to certain stages of a fabrication process consistent with the disclosed embodiments.

As shown in FIG. 1, at the beginning of the fabrication process, a semiconductor substrate 100 is provided. The semiconductor substrate 100 may be made of monocrystalline silicon. Further, the semiconductor substrate 100 may have certain gate structures 101. The gate structures 101 may have a spacer layer 102 located on sidewalls. The spacer layer 102 may be made of silicon nitride, silicon oxide, or a combination thereof. Moreover, certain trenches (no shown on here) may be formed in the semiconductor substrate 100 located on the two sides of the floating gate structures 101.

As shown in FIG. 1, performing an epitaxy process by using a carbon source gas (e.g., $CH_4$ and/or $C_2H_4$) and a silicon source (e.g., $SiH_4$ and/or $SiH_2Cl_2$), a silicon carbide layer 108 is formed. The silicon carbide layer 108 may cover the surface of the gate structure 101, the spacer layer 102, and the semiconductor substrate 100. Further, the silicon carbide growth rate may be faster on monocrystalline silicon compared with that on a silicon nitride and/or a polysilicon. Thus, the silicon carbide layer 108 may have two parts, a first part 104 located on the surface of the semiconductor substrate 100, and a second part 105 located on the surface of the gate structures 101 and the spacer layer 102. Moreover, the first part 104 may be thicker than the second part 105. The first part 104 may be formed by monocrystalline silicon carbide, and the second part 105 may be formed by polycrystalline silicon carbide.

As shown in FIG. 2, a first epitaxial silicon carbide layer 106 is formed on the surface of the semiconductor substrate 100 located on the two sides of the gate structures 101. The first epitaxial silicon carbide layer 106 may be formed by an etching process, using an etching gas (e.g., HCl). During the etching process, the silicon carbide layer 108 located on the surface of the gate structures 101 and the spacer layer 102 may be removed. Further, because the first part silicon carbide layer 104 and the second part silicon carbide layer 105 may have a different thickness and different crystal structures, the etching rate of the first part silicon carbide layer 104 and the second part silicon carbide layer 105 may be different. Thus, the formed first epitaxial silicon carbide layer 106 may have inclined sidewalls. The crystal orientation on the inclined sidewalls may be different as on the surface of the semiconductor substrate 100. Thus, the inclined sidewalls may influent the subsequent epitaxial silicon carbide layer formation process. More specifically, the inclined sidewalls may influent the growth rate of the epitaxial silicon carbide in horizontal direction and the crystal structure of the formed epitaxial silicon carbide on the sidewalls. Thus the elevated source/drain regions formed by repeating the epitaxy process and the etching process may have sharp angles. That is, the formed elevated source/drain regions 107 (FIG. 3) through repeating the epitaxy process (FIG. 1) and the etching process (FIG. 2) may have sharp angles.

According to the above analysis, though the elevated source/drain regions formed by the illustrated method may have few defect and may have low resistance, the possibly formed sharp angles on the elevated source/drain regions may have a significant influence to certain subsequent metal silicide formation process and wire plugging process, thus is bad for performing subsequent fabrication process.

This disclosure provides a semiconductor structure fabrication method. More specifically, after the epitaxy process and the etching process, a selective epitaxy process may be performed. The selective epitaxy process may form a second epitaxial semiconductor layer. The second epitaxial semiconductor layer may repair and compensate the first epitaxial layer along the horizontal direction. Thus, the inclined sidewalls of the first epitaxial layer may become vertical sidewalls. Then, repeating the epitaxy process, the etching process, and the selective epitaxy process, the elevated source/drain regions may be formed on the semiconductor substrate located on the two sides of the gate structures. The newly formed elevated source/drain regions may have no angles, or may only have wide angles.

Figure 4:
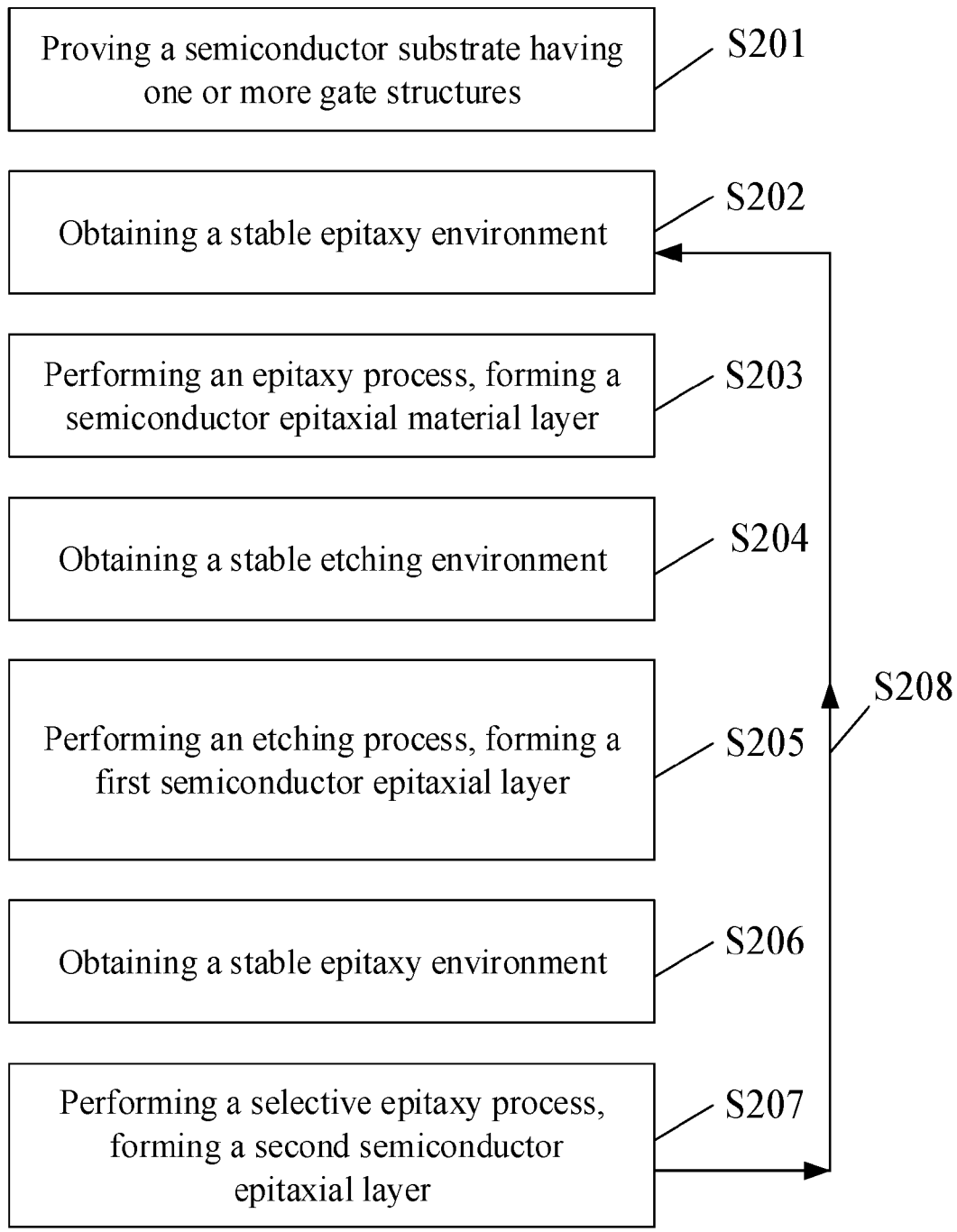
FIG. 4 illustrates a flow chart of an exemplary semiconductor structure fabrication method consistent with the disclosed embodiments.

FIG. 4 illustrates a flow chart of an exemplary semiconductor structure fabrication method consistent with the disclosed embodiments. As shown in FIG. 4, the semiconductor structure fabrication method may include the following steps.

Step S201, proving a semiconductor substrate, wherein, certain gate structures may be formed on the surface of the semiconductor substrate; a spacer layer may be formed on the sidewalls of the gate structures, and the naturally formed oxide layer on the substrate may be removed.

Step S202, obtaining a stable epitaxy environment.

Step S203, performing an epitaxy process by using certain proper deposition gases, forming a semiconductor epitaxial material layer that covers the gate structures, the spacer layer, and the surface of the semiconductor substrate.

Step S204, obtaining a stable etching environment.

Step S205, performing an etching process by using certain proper etching gases, removing the semiconductor epitaxial material layer located on the sidewalls and on the gate structures, forming a first semiconductor epitaxial layer on the semiconductor substrate located on the two sides of the gate structures.

Step S206, obtaining a stable selective epitaxy environment.

Step S207, performing a selective epitaxy process by using certain proper deposition gases and etching gases, forming a second semiconductor epitaxial layer on the semiconductor substrate located on the two sides of the gate structure, wherein, the second semiconductor epitaxial layer may repair and compensate the first semiconductor epitaxial layer along the horizontal direction.

Step S208, repeating steps S202-207, forming elevated source/drain regions.

An exemplary semiconductor structure during certain stages of the fabrication process is used to illustrate the fabrication process in more details.

Figure 5:
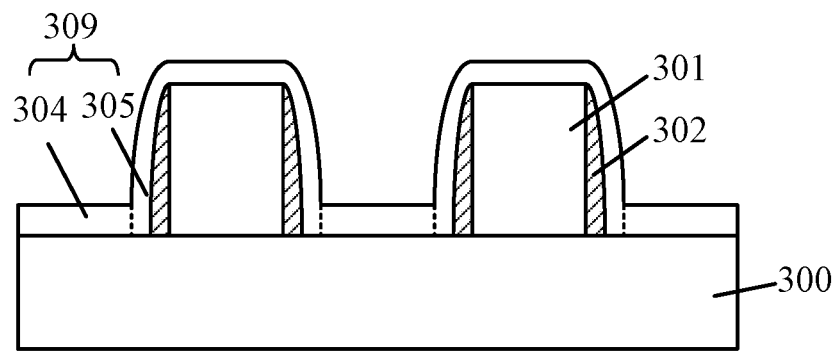
FIGS. 5-8 illustrate sectional views of another semiconductor structure corresponding to certain stages of a fabrication process consistent with the disclosed embodiments

As shown in FIG. 5, a semiconductor substrate 300 is provided at the beginning of the fabrication process. Certain gate structures 301 may be formed on the surface of the semiconductor substrate 300. And a spacer layer 302 may be formed on sidewalls of the gate structures 301.

The semiconductor substrate 300 may be made of any appropriate type of semiconductor materials, such as silicon, germanium, silicon germanium, silicon carbide, silicon on insulator, germanium on insulator, glass or some III-V group elements compounds, such as gallium nitride (GeN), gallium arsenide (GaAs), or a combination there of. In one embodiment, the semiconductor substrate is made of monocrystalline silicon. The top surface of the semiconductor substrate may have lattice plane indices or Miller indices of (100). Thus, the semiconductor epitaxial layer formed subsequently on the surface of the semiconductor substrate 300 may be a monocrystalline epitaxy layer. The substrate 300 may be doped to change certain electrical parameters depending on design requirements. Certain shallow trench insulation structures (not shown in FIG. 5) may be formed in the semiconductor substrate. The shallow trench insulation structures may be used to insulate adjacent source regions.

Moreover, the gate structures 301 may include a dielectric layer (not shown in FIG. 5) located on the substrate 300, and an electrode layer (not shown in FIG. 5) located on the dielectric layer. Process for forming the gate structures 301 may include forming a dielectric material layer on the semiconductor substrate 300; forming an electrode material layer on the dielectric material layer; and forming a hard mask layer on the electrode material layer. The process for forming the gate structures 301 may further include forming certain openings on the hard mask layer, where the openings may expose the surface of the dielectric material layer and, finally, forming the dielectric layer located on the semiconductor substrate 300 and the electrode layer located on the dielectric layer by etching the dielectric material layer and the electrode material layer through the openings on the hard mask layer.

Figure 8:
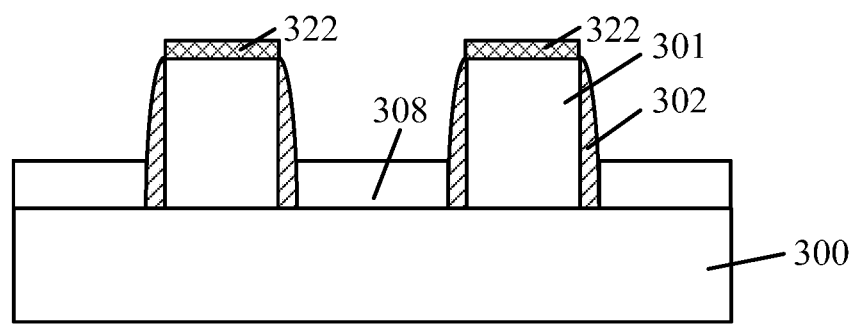

In addition, the hard mask layer may be made of silicon nitride (SiN), silicon oxynitride (SiON), silicon carbon nitride (SiCN), or other proper materials. After forming the gate structures 301, a portion 322 of the hard mask layer located on the top surface of the gate structures 301 may be kept as shown in FIG. 8. Thus, during the subsequent epitaxial step, the semiconductor epitaxy material layer may have a significant slower growth rate on the top surface of the gate structures compared with that on the surface of the semiconductor substrate. Thereby, the thickness of the semiconductor epitaxial material layer located on the gate structures is significantly smaller than the thickness of the semiconductor epitaxial material layer located on the surface of the semiconductor substrate. Thus, when performing the etching step, the process burden of the etching process may be reduced, and the sidewalls of the formed first semiconductor epitaxial layer may have a desired morphology.

Further, the dielectric layer may be made of silicon oxide. The electrode layer may be made of polysilicon. In certain embodiments, the dielectric layer and the electrode layer may be made of other proper materials.

Moreover, the spacer layer 302 may have a single layer structure, or may have a stacked multilayer structure. For the stacked multilayer structure scenario, the spacer layer 302 may include an offset spacer layer located on the sidewalls of the gate structures, and a main spacer layer located on the offset spacer layer. The offset spacer layer may be made of silicon oxide. After forming the offset spacer layer, a light iron implantation process may be performed to the semiconductor substrate 300 located on the two sides of the gate structures 301. Thus certain lightly doped regions may be formed in the semiconductor substrate 300 located on the two sides of the gate structures 301.

After forming the light doped regions, the main spacer layer may be formed on the offset spacer layer. Further, the main spacer layer has a single layer structure, or may have a stacked multilayer structure. For the single layer structure scenario, the main spacer layer may be made of silicon nitride. For the stacked multilayer structure scenario, the main spacer layer may include a silicon nitride spacer layer and a silicon dioxide spacer layer formed on the silicon nitride spacer layer.

In certain other embodiments consistent with the present disclosure, certain trenches may be formed in the substrate 300 located on the two sides of the gate structures 301 after forming the spacer layer 302. The trenches may be formed by etching the semiconductor substrate 300 located on the two sides of the gate structures 301 with the spacer layer 302 working as a mask. The epitaxy process, the etching process, and the selective epitaxy process may be repeated successively to form the elevated source/drain regions inside the trenches. The surface of the elevated source/drain regions may be above the surface of the substrate.

Further, the trenches may have a "s" shaped profile. Thus, the subsequently formed stressed elevated source/drain regions inside the trenches may be closer to the trenches of the transistors. Thereby, carrier mobility may be enhanced.

An exemplary process for forming the "δ" shaped trenches may include forming a rectangular shaped trench by etching the semiconductor substrate through a dry etching process; then forming the "δ" shaped trenches by further etching the rectangular shaped trenches through a wet etching process. The gas used for the dry etching process may include tetrafluoromethane ($CF_4$), hydrogen bromide (HBr), helium (He), and/or oxygen ($O_2$). The solution used for the wet etching process may include tetramethylammonium hydroxide (TMAH) and/or ammonia-water ($NH_3 \cdot H_2O$).

As shown in FIG. 5, after performing an epitaxy process with proper deposition gases, a semiconductor epitaxial material layer 309 is formed. The semiconductor epitaxial material layer 309 may cover the gate structures 301, the spacer layer 302, and the surface of the semiconductor substrate 300.

Moreover, the semiconductor epitaxy material layer 309 may include two adjacent parts, a first part 304 located on the surface of the semiconductor substrate 300, and a second part 305 located on the surface of the floating gate structures 301 and the spacer layer 302. Because the material of the floating gate structures 301 and the spacer layer 302 may be different with the material of the semiconductor substrate 300, and because the semiconductor epitaxial material in the second part 305 located on the gate structures 301 and on the spacer layer 302 may have a slower growth rate than that of the semiconductor epitaxial material in the first part 304, the thickness of the semiconductor epitaxial material in the second part 305 may be smaller than the thickness of the semiconductor epitaxial material in the first part 304. Further, the semiconductor epitaxial material in the second part 305 may have a polycrystalline (amorphous crystalline) structure. And the semiconductor epitaxial material in the first part 304 may have a monocrystalline structure.

In addition, the semiconductor epitaxial material layer 309 may be made of silicon carbide, silicon germanium, or monocrystalline silicon.

When the semiconductor epitaxial material layer 309 is made of the silicon carbide, the epitaxy process may use certain carbon source gases including $CH_4$, $C_2H_4$, $C_3H_8$, $C_2H_6$, or $C_4H_8$, with a flow rate ranging from 10 sccm to 50 sccm. And, the epitaxy process may use certain silicon source gases including $SiH_4$, or $SiH_2Cl_2$, with a flow rate ranging from 100 sccm to 500 sccm. Further, during the epitaxy process, certain carrier gases such as hydrogen ($H_2$) may be used. The carrier gas may have a flow rate ranging from 2000 sccm to 6000 sccm. The chamber pressure may range from 5 Torr to 100 Torr, the chamber temperature may range from 500° C. to 700° C. And the time duration of the epitaxy process may range from 1 second to 20 seconds.

Further, the formed silicon carbide may have certain N-type impurity irons. The N-type impurity irons may include phosphorus ions, arsenic ions, antimony ions, or a combination thereof. When performing the epitaxy process, certain impurity gases such as $PH_3$, $AsH_3$, $TeH_3$, or a combination thereof may be supplied. Thus, an N-type doping process may be performed at the same time.

When the semiconductor epitaxial material layer 309 is made of the silicon germanium, the epitaxy process may use certain germanium source gases including $GeH_4$, with a flow rate ranging from 5 sccm to 500 sccm. And, the epitaxy process may use certain silicon source gases including $SiH_4$, or $SiH_2Cl_2$, with a flow rate ranging from 50 sccm to 1000 sccm. Further, during the epitaxy process, certain carrier gases such as hydrogen ($H_2$) may be used. The flow rate of the carrier gas may range from 2000 sccm to 20000 sccm. The chamber pressure may range from 1 Torr to 500 Torr, the chamber temperature may range from 500° C. to 700° C. And the time duration of the epitaxy process may range from 1 second to 50 seconds. The deposition gas may include the germanium source gas, the silicon source gas, and the carrier gas.

Further, the formed silicon germanium may have certain P-type impurity irons. The P-type impurity irons may include boron irons, gallium irons, indium ions, or a combination thereof. When performing the epitaxy process, certain impurity gases containing boron, gallium, or indium element may be supply. Thus, a P-type doping process may be performed at the same time.

When the semiconductor epitaxial material layer 309 is made of the monocrystalline silicon, the epitaxy process may use certain silicon source gases including $SiH_4$ or $SiH_2Cl_2$, with a flow rate ranging from 50 sccm to 1000 sccm. During the epitaxy process, certain carrier gases such as hydrogen (H2) may be used. The flow rate of the carrier gas may range from 2000 sccm to 20000 sccm. The chamber pressure may range from 1 Torr to 500 Torr, the chamber temperature may range from 500° C. to 700° C. And the time duration of the epitaxy process may range from 1 second to 50 seconds. Further, the formed monocrystalline silicon may have certain P-type or N-type impurity irons.

Moreover, before performing the epitaxy process, the thermal silicon oxide layer on the surface of the semiconductor substrate may be removed. The process to remove the thermal silicon oxide layer may be performed in the same chamber where the epitaxy process is performed. After removing the thermal silicon oxide layer, a stable epitaxy environment may need to be obtained before performing the epitaxy process. That is, the chamber achieves a predefined temperature and pressure level. The residual gases and byproducts from etching the thermal silicon oxide layer are removed.

In certain embodiments, when the semiconductor structure has certain trenches formed on the two sides of the gate structures and/or the spacer layer, the formed semiconductor epitaxial material layer may be located on the sidewalls and at the bottom of the trenches. The semiconductor epitaxial material layer may include adjacent two parts, a first part located on the sidewalls and at the bottom of the trenches, and a second part located on the surface of the gate structures and the spacer layer. Before performing the epitaxy process, the thermal silicon oxide layer at the bottom and on the sidewalls of the trenches may be removed. After removing the thermal silicon oxide layer, the step to obtain a stable epitaxy environment may be performed.

Figure 6:
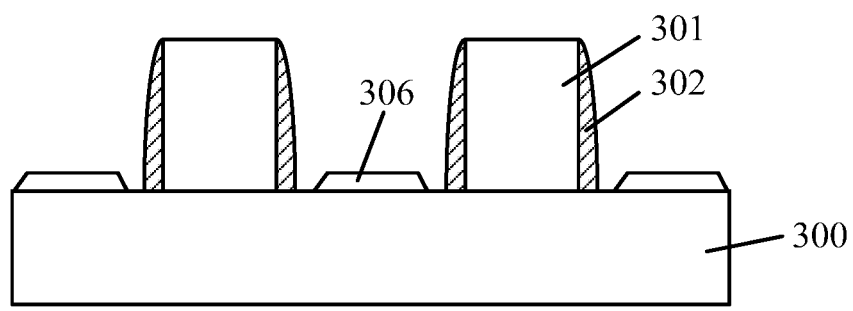

As shown in FIG. 6, after performing an etching process by using proper etching gases, a first semiconductor epitaxial layer 306 is formed. More specifically, during the etching process, the semiconductor epitaxial material layer located on the surface of the spacer layer 301 and the gate structures 301 is removed, thus the first semiconductor epitaxial layer 306 is formed on the semiconductor substrate 300 located on the two sides of the gate structures 301.

In one embodiment, the semiconductor epitaxial material layer may be made of the silicon carbide. The etching process for selectively removing the silicon carbide layer may use certain etching gases such as HCl or $Cl_2$. The flow rate of the etching gas may range from 5000 sccm to 25000 sccm, the chamber pressure may range from 10 Torr to 500 Torr, the chamber temperature may range from 500° C. to 700° C., and the etching duration may range from 3 seconds to 50 seconds.

In certain embodiments, the semiconductor epitaxial material layer may be made of the silicon germanium. The etching process for selectively removing the silicon germanium layer may use certain etching gases such as HCl or $Cl_2$. The flow rate of the etching gas may range from 500 sccm to 25000 sccm, the chamber pressure may range from 10 Torr to 500 Torr, the chamber temperature may range from 500° C. to 700° C., and the etching duration may range from 3 seconds to 100 seconds.

In certain embodiments, the semiconductor epitaxial material layer may be made of the monocrystalline silicon. The etching process for selectively removing the monocrystalline silicon layer may use certain etching gases such as HCl or $Cl_2$. The flow rate of the etching gas may range from 500 sccm to 25000 sccm, the chamber pressure may range from 10 Torr to 500 Torr, the chamber temperature may range from 500° C. to 700° C., and the etching duration may range from 3 seconds to 100 seconds.

More specifically, the semiconductor epitaxial material layer in the first part 304 (FIG. 5) may be monocrystalline material, while the semiconductor epitaxial material layer in the second part 305 (FIG. 5) may be polycrystalline (or amorphous) material. And the thickness of the second part 305 may be less than the thickness of the first part 304. Further, the HCl or $Cl_2$ may have a faster etching speed in etching the polycrystalline semiconductor epitaxial material than etching the monocrystalline semiconductor epitaxial material. Thus, a residual semiconductor epitaxial material layer of certain thickness may be left on the substrate 300 located on the two sides of the gate structures 301, forming the first semiconductor epitaxial layer 306. Moreover, the HCl or $Cl_2$ may have an isotropic etching property. The etching speed of the monocrystalline semiconductor epitaxial material layer and the polycrystalline semiconductor epitaxial material located at the interface between the first part 304 and the second part 305 may be different. Thus, the formed first semiconductor epitaxial layer 306 may have inclined sidewalls. In addition, the first semiconductor epitaxial layer 306 may not contact with the adjacent spacer layer 302.

Thus, the first semiconductor epitaxial layer 306 may have inclined sidewalls (the surface of the sidewalls may form an angle with the surface of the substrate). The surface index of the inclined sidewalls of the first semiconductor epitaxial layer 306 may be different with the surface index of the surface of the semiconductor substrate 300. The crystal orientation directions are different.

If the subsequent epitaxy process and etching process are preformed directly, it is possible that, during the epitaxy process, the formed semiconductor epitaxial material located on the inclined sidewalls may be amorphous or polycrystalline material with many defects, and during the etching process, the amorphous or polycrystalline material with many defects may be removed very fast. Thus, after the process, the semiconductor epitaxial material layer located on the crystal surface with Miller indices of (100) grows fast, while the semiconductor epitaxial material layer located on the inclined sidewalls grows slow or does not grow at all. Thus, the finally formed semiconductor epitaxial layer (or the elevated source/drain regions) may have sharp angles.

However, in this disclosure, after the etching process, a selective epitaxy process is performed. During the selective epitaxy process, the growth rate of the first the semiconductor epitaxial layer 306 along the horizontal direction, and the growth rate of the semiconductor epitaxial material (or called a second semiconductor epitaxial layer) located on the inclined sidewalls may be repaired and compensated.

Further, the etching process and the epitaxy process may be performed in a same chamber. Before performing the etching process, it may need to obtain a stable etching environment first. The stable etching environment may have the chamber to achieve a predefined temperature and pressure level. The residual gases and byproducts from the epitaxy process may be removed. Thus, the etching process may be stable, and the etching may be more accurate.

Figure 7:
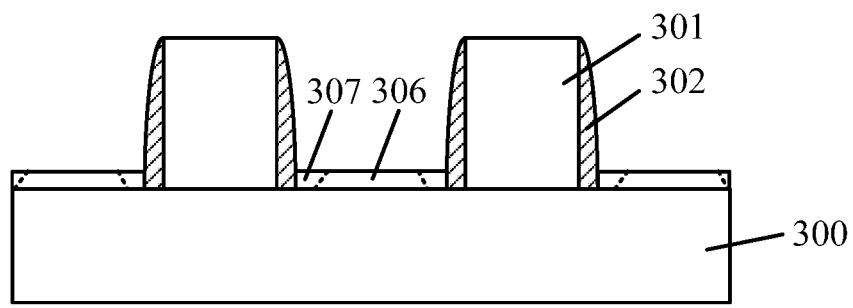

As shown in FIG. 7, after performing a selective epitaxy process by using certain deposition gases and etching gases, a second semiconductor epitaxial layer may be formed on the substrate 300 located on the two sides of the gate structures 301. The second semiconductor epitaxial layer 307 may repair and compensate the first semiconductor epitaxial layer 306 along the horizontal direction.

More specifically, during the selective epitaxial process, an epitaxy process and an etching process may be performed at the same time in the same chamber. The processing environment may change compared with the pure epitaxy process and the pure etching process. Thus, the growth rate of the semiconductor epitaxial material layer along the horizontal direction and along the crystal surface direction located on the inclined sidewalls may be repaired and compensated. Thereby, the growth rate of the semiconductor epitaxial material layer along the horizontal direction and along the crystal surface direction located on the inclined sidewalls and the growth rate of the semiconductor epitaxial material layer along the direction of the semiconductor substrate surface may have a reduced variation. Thus the formed second semiconductor epitaxial layer 307 may cover the inclined sidewalls of the first semiconductor epitaxial layer 306, and may contact with the surface of the spacer layer 302.

Further, the second semiconductor epitaxial layer 307 and the first semiconductor epitaxial layer 306 may be made of the same material. Thus, the second semiconductor epitaxial layer 307 and the first semiconductor epitaxial layer 306 may have the same crystal structure. Thereby, during the selective epitaxy process, repairing or compensating the first semiconductor epitaxial layer 306 along the horizontal direction may become easier. After the repairmen or compensation, the formed second semiconductor epitaxial layer 307 may cover the inclined sidewalls of the first semiconductor epitaxial layer 306, and may contact with the surface of the spacer layer 302. Thus, when repeating the epitaxy process, the etching process, and the selective epitaxy process successively, the finally formed elevated source/drain regions may have no sharp angles, or may only have wide angles. In certain embodiments, the formed second semiconductor epitaxial layer 307 may cover the inclined sidewalls of the first semiconductor epitaxial layer 306, and may also cover the top surface of the first semiconductor epitaxial layer 306.

In one embodiment, the second semiconductor epitaxial layer 307 may be made of the silicon carbide. The selective epitaxy process may use certain carbon source gases such as $CH_4$, $C_2H_4$, $C_3H_8$, $C_2H_6$, or $C_4H_8$, with a flow rate ranging from 10 sccm to 50 sccm. And, the selective epitaxy process may use certain silicon source gases such as $SiH_4$, or $SiH_2Cl_2$, with a flow rate ranging from 50 sccm to 300 sccm. Further, the selective epitaxy process may use certain etching gases such as HCl and/or $Cl_2$, with a flow rate ranging from 50 sccm to 200 sccm. During the selective epitaxy process, certain carrier gases such as hydrogen ($H_2$) may be used. The carrier gas may have a flow rate ranging from 10000 sccm to 40000 sccm. The chamber pressure may range from 5 Torr to 100 Torr, the chamber temperature may range from 500° C. to 700° C. And the time duration of the selective epitaxy process may range from 10 seconds to 200 seconds to obtain a good compensation and repairing result. The deposition gas may include the carbon source gas, the silicon gas, and the carrier gas.

In certain embodiments, the second semiconductor epitaxial layer 307 may be made of the silicon germanium. In this scenario, the selective epitaxy process may use certain germanium source gases such as $GeH_4$, with a flow rate ranging from 5 sccm to 500 sccm. And, the selective epitaxy process may use certain silicon source gases such as $SiH_4$, or $SiH_2Cl_2$, with a flow rate ranging from 50 sccm to 800 sccm. Further, the selective epitaxy process may use certain etching gases such as HCl and/or $Cl_2$, with a flow rate ranging from 5 sccm to 500 sccm.

During the selective epitaxy process, certain carrier gases such as hydrogen ($H_2$) may be used. The flow rate of the carrier gas may range from 2000 sccm to 15000 sccm. The chamber pressure may range from 1 Torr to 500 Torr, the chamber temperature may range from 500° C. to 700° C. And the duration of the selective epitaxy process may range from 5 seconds to 300 seconds to obtain a good repairing and compensation result. The deposition gas may include the germanium source gas, the silicon source gas, and the carrier gas.

In certain embodiments, the second semiconductor epitaxial layer 307 may be made of monocrystalline silicon. In this scenario, the selective epitaxy process may use certain silicon source gases such as $SiH_4$, or $SiH_2Cl_2$, with a flow rate ranging from 50 sccm to 800 sccm. Further, the selective epitaxy process may use certain etching gases such as HCl and/or $Cl_2$, with a flow rate ranging from 5 sccm to 500 sccm. Further, certain carrier gases such as hydrogen ($H_2$) may be used. The flow rate of the carrier gas may range from 2000 sccm to 15000 sccm. The chamber pressure may range from 1 Torr to 500 Torr, the chamber temperature may range from 500° C. to 700° C. And the time duration of the selective epitaxy process may range from 5 seconds to 300 seconds to obtain a good repairing and compensation result. The deposition gas may include the silicon source gas and the carrier gas.

Further, when performing the selective epitaxial process, certain impurity gases may be used to introduce P-type or N-type impurities into the formed second semiconductor epitaxial layer 307. More specifically, the formed silicon carbide may be doped with certain N-type irons, the formed silicon germanium may be doped with certain P-type irons, and the formed monocrystalline silicon may be doped with either N-type irons or P-type irons.

Moreover, the selective epitaxy process and the prior etching process and epitaxy process may be performed in the same chamber. Thus, before performing the selective epitaxy process, a stable selective epitaxy environment may be obtained first. The chamber may achieve a predefined temperature and pressure level. The residual gases and byproducts from the prior etching process are removed. Thus, when performing the selective epitaxy process, the process may be stable and the accuracy may be enhanced.

As shown in FIG. 8, certain elevated source/drain regions 308 are formed on the semiconductor substrate 300 located on the two sides of the gate structures 301. The elevated source/drain regions 308 may be formed by successively repeating the epitaxy process (FIG. 5), the etching process (FIG. 6) and the selective epitaxy process (FIG. 7). The epitaxy, the etching process, and the selective epitaxy process may be repeated one or more times depending on actual fabrication requirements. Further, the formed elevated source/drain regions 308 may have no angles, or may only have wide angles. Further, the two sides of the formed elevated source/drain regions 308 may contact with the adjacent spacer layer 302. Further, other fabrication processes may be performed to create semiconductor structures, components, and/or devices.

Thus, according to disclosed embodiments, semiconductor structures and fabrication methods are provided. In an exemplary fabrication method, an epitaxy process is performed first by using certain deposition gases. Thus, a semiconductor epitaxial material layer may be formed covering the gate structures, the spacer layer, and the surface of the semiconductor substrate. Then, an etching process is performed by using certain etching gases. In this process, the semiconductor epitaxial material layer located on the spacer layer and on the surface of the gates structures may be removed. Thus, a first semiconductor epitaxial layer may be formed on the semiconductor substrate located on the two sides of the gate structures.

Next, a selective epitaxy process may be performed after the epitaxy process and the etching process, and a second semiconductor epitaxial layer may be formed. The formed second semiconductor epitaxial layer may repair and compensate the first semiconductor epitaxial layer along the horizontal direction. Thus, the inclined sidewalls of the first semiconductor epitaxial layer may become vertical sidewalls. The epitaxy process, the etching process, and the selective epitaxy process may be repeated successively one or more times. Thus, certain elevated source/drain regions may be formed on the semiconductor substrate located on the two sides of the gate structures. The formed elevated source/drain regions may have a flat top surface without any angles. Or the formed elevated source/drain regions may only have few wide angles.

Embodiments consistent with the current disclosure provide a semiconductor structure fabrication method. Other applications, advantages, alternations, modifications, or equivalents to the disclosed embodiments are obvious to those skilled in the art. It is intended that the specification and examples be considered as exemplary only, with a true scope and spirit of the invention being indicated by the claims.

What is claimed is:

1. A semiconductor structure fabrication method, comprising:
   providing a semiconductor substrate having one or more gate structures, sidewalls of the gate structures being covered by a spacer layer;
   performing an epitaxy process using a deposition gas to form a semiconductor epitaxial material layer covering the gate structures, the spacer layer, and the semiconductor substrate;
   performing an etching process using an etching gas to remove the semiconductor epitaxial material layer located on the spacer layer and on the gate structures to form a first semiconductor epitaxial layer on the semiconductor substrate at two sides of the gate structures;
   performing an selective epitaxy process using the deposition gas and the etching gas to form a second semiconductor epitaxial layer on the semiconductor substrate at the two sides of the gate structures, wherein the second semiconductor epitaxial layer repairs or compensates the first semiconductor epitaxial layer along a horizontal direction; and
   repeating the epitaxy process, the etching process, and the selective epitaxy process successively one or more times to form elevated source and drain regions on the semiconductor substrate at the two sides of the gate structures.

2. The method according to claim 1, wherein:
   the first semiconductor epitaxial layer and the second semiconductor epitaxial layer are made of a same material, including one or more of silicon carbide, silicon germanium, and monocrystalline silicon.

3. The method according to claim 2, wherein each of the first semiconductor epitaxial layer and the second semiconductor epitaxial layer is a silicon carbide layer, the epitaxy process for forming the silicon carbide layer is performed by using:

a carbon source gas including $CH_4$, $C_2H_4$, $C_3H_8$, $C_2H_6$, or $C_4H_8$, having a flow rate ranging 10 sccm to 50 sccm;

a silicon source gas including $SiH_4$ or $SiH_2Cl_2$, having a flow rate ranging from 100 sccm to 500 sccm;

a carrier gas including hydrogen ($H_2$) having a flow rate ranging from 2000 sccm to 6000 sccm;

a chamber pressure ranging from 5 Torr to 100 Torr; and a chamber temperature ranging from 500° C. to 700° C.

4. The method according to claim 3, wherein the etching process for forming the first semiconductor epitaxial layer is performed by using:

an etching gas including HCl or $Cl_2$, having a flow rate ranging from 5000 sccm to 25000 sccm;

a chamber pressure ranging from 200 Torr to 500 Torr;

a chamber temperature ranging from 500° C. to 700° C.; and an etching process duration ranging from 3 seconds to 50 seconds.

5. The method according to claim 4, wherein the selective epitaxy process for forming the second semiconductor epitaxial layer is performed by using:

a carbon source gas including $CH_4$, $C_2H_4$, $C_3H_8$, $C_2H_6$, or $C_4H_8$, having a flow rate ranging 10 sccm to 50 sccm;

a silicon source gas including $SiH_4$, or $SiH_2Cl_2$, having a flow rate ranging from 50 sccm to 300 sccm;

an etching gas including HCl or $Cl_2$, having a flow rate ranging from 50 sccm to 200 sccm;

a carrier gas including hydrogen ($H_2$) having a flow rate ranging from 10000 sccm to 40000 sccm;

a chamber pressure ranging from 5 Torr to 100 Torr;

a chamber temperature ranging from 500° C. to 700° C.; and a selective epitaxial process duration ranging from 10 seconds to 200 seconds.

6. The method according to claim 3, wherein:

the silicon carbide layer, used for each of the first semiconductor epitaxial layer and the second semiconductor epitaxial layer, contains N-type impurity irons, including one or more of phosphorus ions, arsenic ions, and antimony ions.

7. The method according to claim 6, wherein:

an impurity gas for performing the epitaxy process and the selective epitaxy process contains one or more of $PH_3$, $AsH_3$, and $TeH_3$.

8. The method according to claim 2, wherein the first semiconductor epitaxial layer and the second semiconductor epitaxial layer are made of the silicon germanium, the epitaxy process for forming the silicon germanium layer is performed by using:

a germanium source gas including $GeH_4$ having a flow rate ranging 5 sccm to 500 sccm;

a silicon source gas including $SiH_4$ or $SiH_2Cl_2$, having a flow rate ranging from 50 sccm to 1000 sccm;

a carrier gas including hydrogen ($H_2$) having a flow rate ranging from 2000 sccm to 20000 sccm;

a chamber pressure ranging from 1 Torr to 500 Torr;

a chamber temperature ranging from 500° C. to 700° C.; and an epitaxial process duration ranging from 1 second to 50 seconds.

9. The method according to claim 8, wherein the etching process for forming the first semiconductor epitaxial layer is performed by using:

an etching gas including HCl or $Cl_2$, having a flow rate ranging from 500 sccm to 25000 sccm;

a chamber pressure ranging from 10 Torr to 500 Torr;

a chamber temperature ranging from 500° C. to 700° C.; and an etching process duration ranging from 3 seconds to 100 seconds.

10. The method according to claim 9, wherein the selective epitaxy process for forming the second semiconductor epitaxial layer is performed by using:

a germanium source gas including $GeH_4$ having a flow rate ranging 5 sccm to 500 sccm;

a silicon source gas including $SiH_4$ or $SiH_2Cl_2$, having a flow rate ranging from 50 sccm to 800 sccm;

an etching gas including HCl or $Cl_2$, having a flow rate ranging from 5 sccm to 500 sccm;

a carrier gas including hydrogen ($H_2$) having a flow rate ranging from 2000 sccm to 15000 sccm;

a chamber pressure ranging from 1 Torr to 500 Torr;

a chamber temperature may ranging from 500° C. to 700° C.; and a selective epitaxial duration ranging from 5 seconds to 300 seconds.

11. The method according to claim 10, wherein:

the germanium carbide layer contains P-type impurity irons, including one or more of boron irons gallium irons, and indium ions.

12. The method according to claim 2, wherein the first semiconductor epitaxial layer and the second semiconductor epitaxial layer are made of the monocrystalline silicon, the epitaxy process for forming the monocrystalline silicon layer is performed by using:

a silicon source gas including $SiH_4$, or $SiH_2Cl_2$, having a flow rate ranging 50 sccm to 1000 sccm;

a carrier gas including hydrogen ($H_2$) having a flow rate ranging from 2000 sccm to 20000 sccm;

a chamber pressure ranging from 1 Torr to 500 Torr;

a chamber temperature ranging from 500° C. to 700° C.; and an epitaxial process duration ranging from 1 second to 50 seconds.

13. The method according to claim 12, wherein the etching process for forming the first semiconductor epitaxial layer is performed by using:

an etching gas including HCl or $Cl_2$, having a flow rate ranging from 500 sccm to 25000 sccm;

a chamber pressure ranging from 10 Torr to 500 Torr;

a chamber temperature ranging from 500° C. to 700° C.; and an etching process duration ranging from 3 seconds to 100 seconds.

14. The method according to claim 13, wherein the selective epitaxy process for forming the second epitaxial layer is performed by using:

a silicon source gas including $SiH_4$, or $SiH_2Cl_2$, having a flow rate ranging from 50 sccm to 800 sccm;

an etching gas including HCl or $Cl_2$, having a flow rate ranging from 5 sccm to 500 sccm;

a carrier gas including hydrogen ($H_2$) having a flow rate ranging from 2000 sccm to 15000 sccm;

a chamber pressure ranging from 1 Torr to 500 Torr;

a chamber temperature may ranging from 500° C. to 700° C.; and a selective epitaxial process duration ranging from 5 seconds to 300 seconds.

15. The method according to claim 14, wherein:

the monocrystalline silicon layer contains P-type or N-type impurity irons.

16. The method according to claim 1, further including, forming a hard mask layer on the top surface of the gate structures.

17. The method according to claim 16, wherein:
the hard mask layer is made of silicon nitride (SiN), silicon oxynitride (SiON), silicon carbon nitride (SiCN), or a combination thereof.

18. The method according to claim 16, wherein:
after forming the gate structures, a portion of the hard mask layer remains on the top surface of the gate structures.

19. The method according to claim 1, wherein, the epitaxy process, the etching process, and the selective epitaxy process are performed in a same chamber;
a stable epitaxy environment is obtained prior performing the epitaxy process;
a stable etching environment is obtained prior performing the etching process; and
a stable selective epitaxy environment is obtained prior performing the selective epitaxy process.

* * * * *